United States Patent
Sheridan et al.

(10) Patent No.: US 7,208,115 B2
(45) Date of Patent: Apr. 24, 2007

(54) METHOD OF FABRICATING A POLYMER MATRIX COMPOSITE ELECTROMAGNETIC SHIELDING STRUCTURE

(75) Inventors: Edward W. Sheridan, Ocala, FL (US);
Walter B. May, Orlando, FL (US);
Gene P. Shumaker, Orlando, FL (US);
Michael Griffith, Oakland, FL (US);
Donald G. Rollin, Orlando, FL (US);
Bobby G. Isler, Lady Lake, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 255 days.

(21) Appl. No.: 10/401,873

(22) Filed: Mar. 31, 2003

(65) Prior Publication Data

US 2004/0188890 A1    Sep. 30, 2004

(51) Int. Cl.
*B32B 37/16* (2006.01)
(52) U.S. Cl. .................. 264/258; 264/328.1; 264/571; 156/285; 174/35 MS
(58) Field of Classification Search ......... 156/285, 156/324, 382; 264/258, 328.1, 571; 428/113, 428/297.4, 298.7–301.4, 361; 174/35 MS; 442/366, 376, 377, 380, 381, 389–393, 417
See application file for complete search history.

(56) References Cited

U.S. PATENT DOCUMENTS

| 4,227,037 A | * | 10/1980 | Layton .................. 174/35 MS |
| 4,385,957 A | * | 5/1983 | Wackerle et al. ........ 156/273.9 |
| 4,435,465 A | | 3/1984 | Ebneth et al. |
| 4,471,015 A | | 9/1984 | Ebneth et al. |
| 4,474,685 A | | 10/1984 | Annis |
| 4,614,684 A | | 9/1986 | Ebneth et al. |
| 4,631,214 A | | 12/1986 | Hasegawa |

(Continued)

FOREIGN PATENT DOCUMENTS

EP    0 561 064 A1    9/1993

(Continued)

OTHER PUBLICATIONS

H. Wade Swinford, "Electromagnetic Behavior of Radar Absorbing Chaff (RAC)", Naval Weapons Center Technical Note 354-43 (1975).

(Continued)

*Primary Examiner*—Jessica Rossi
(74) *Attorney, Agent, or Firm*—Buchanan Ingersoll & Rooney PC

(57) ABSTRACT

An exemplary method of manufacturing a polymer matrix composite electromagnetic shielding structure includes pretreating a dry fiber reinforcement with a composition including a carrier and a conductive element, laying out the pretreated reinforcement to form a pre-form structure, applying a resin to the pre-form structure, and curing the resin at room temperature. Another exemplary method of manufacturing a polymer matrix composite electromagnetic shielding structure includes laying out a plurality of dry fiber reinforcements, placing at least one ply between any two of the plurality of dry fiber reinforcements, the ply having a non-woven including a conductive material, applying a resin to the plurality of dry fiber reinforcements and the at least one ply, and curing the resin.

24 Claims, 5 Drawing Sheets

U.S. PATENT DOCUMENTS

Figure 1:
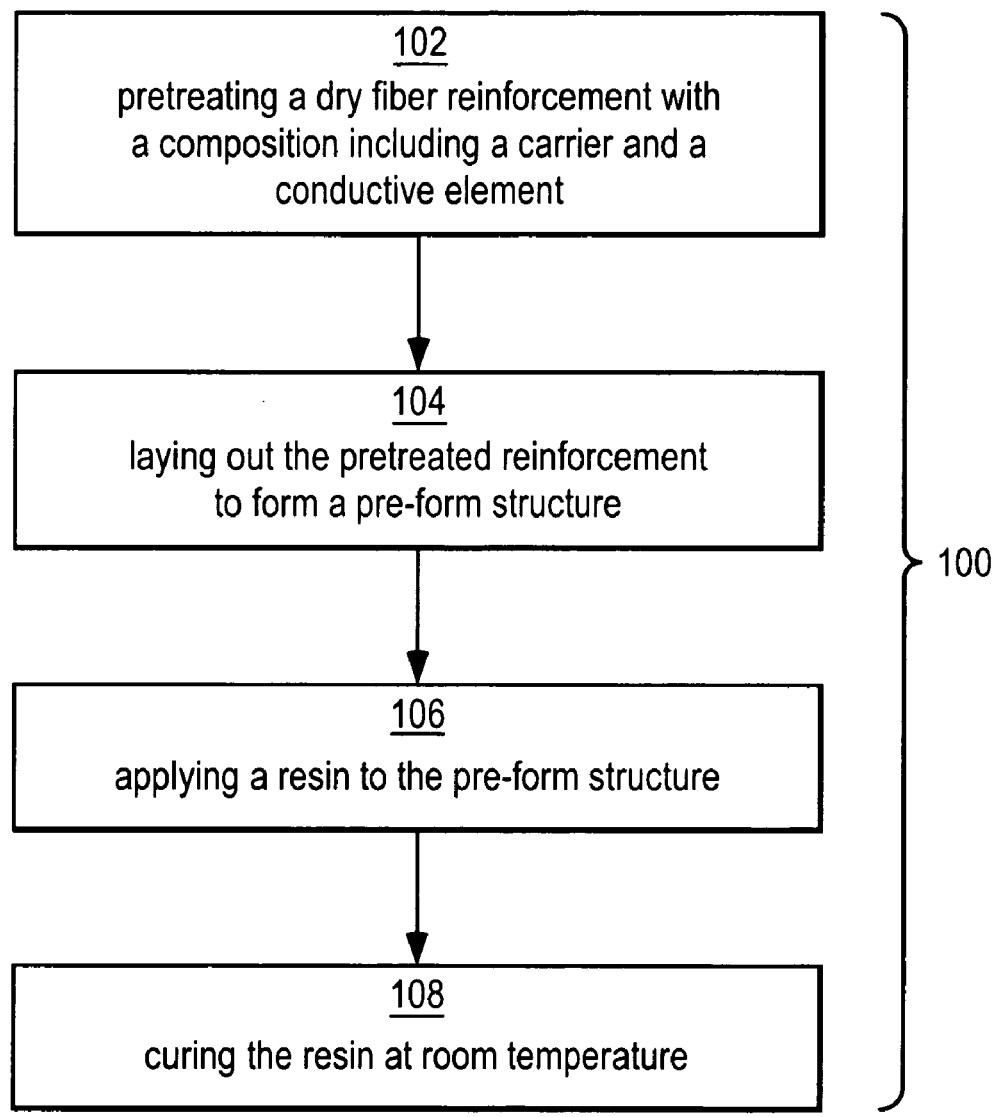

| | | | |
|---|---|---|---|
| 4,678,699 A | 7/1987 | Kritchevsky et al. | |
| 4,686,127 A | 8/1987 | Burns et al. | |
| 4,686,141 A | 8/1987 | Burns et al. | |
| 4,784,899 A | 11/1988 | Ono et al. | |
| 4,826,718 A | 5/1989 | Unsworth et al. | |
| 4,888,234 A | 12/1989 | Smith et al. | |
| 4,935,296 A | 6/1990 | Stevens | |
| 4,965,408 A | 10/1990 | Chapman et al. | |
| 4,983,456 A | 1/1991 | Iwaskow et al. | |
| 4,996,109 A * | 2/1991 | Krieg et al. | 428/304.4 |
| 5,089,326 A | 2/1992 | Bonazza | |
| 5,139,850 A | 8/1992 | Clarke et al. | |
| 5,185,381 A | 2/1993 | Ruffoni | |
| 5,202,536 A | 4/1993 | Buonanno | |
| 5,250,342 A | 10/1993 | Lang et al. | |
| 5,275,861 A | 1/1994 | Vaughn | |
| 5,400,043 A | 3/1995 | Arceneaux et al. | |
| 5,492,719 A | 2/1996 | De Cooper Jones | |
| 5,519,168 A * | 5/1996 | Owens | 174/35 MS |
| 5,591,382 A * | 1/1997 | Nahass et al. | 252/511 |
| 5,635,252 A | 6/1997 | Fraser, Jr. et al. | |
| 5,661,484 A | 8/1997 | Shumaker et al. | |
| 5,721,019 A * | 2/1998 | Ashcraft et al. | 427/425 |
| 5,726,106 A | 3/1998 | Klason et al. | |
| 5,840,383 A | 11/1998 | Kotz et al. | |
| 5,855,988 A | 1/1999 | Matsuo | |
| 5,885,513 A | 3/1999 | Louderback et al. | |
| 5,885,911 A | 3/1999 | Ashcraft et al. | |
| 5,902,535 A | 5/1999 | Burgess et al. | |
| 5,935,722 A | 8/1999 | Moorhead et al. | |
| 5,945,213 A | 8/1999 | Nagaike et al. | |
| 6,013,376 A | 1/2000 | Yenni, Jr. | |
| 6,043,169 A | 3/2000 | Jaffee | |
| 6,090,473 A | 7/2000 | Yoshikawa et al. | |
| 6,143,674 A | 11/2000 | Marutsuka | |
| 6,150,754 A | 11/2000 | Yoshikawa et al. | |
| 6,187,120 B1 | 2/2001 | Ono et al. | |
| 6,188,174 B1 | 2/2001 | Marutsuka | |
| 6,195,034 B1 | 2/2001 | Tsuno et al. | |
| 6,210,787 B1 | 4/2001 | Goto et al. | |
| 6,214,454 B1 | 4/2001 | Kanda et al. | |
| 6,255,778 B1 | 7/2001 | Yoshikawa et al. | |
| 6,262,364 B1 | 7/2001 | Yoshikawa et al. | |
| 6,265,466 B1 | 7/2001 | Glatkowski et al. | |
| 6,689,835 B2 * | 2/2004 | Amarasekera et al. | 524/495 |

FOREIGN PATENT DOCUMENTS

| | | |
|---|---|---|
| WO | 99/12727 | 3/1999 |
| WO | 02/18127 A1 | 3/2002 |

OTHER PUBLICATIONS

Arthur Gauss, Jr., "RACO, A New Type of Radar Absorbing Coating", Technical Report ARBRL-TR-02357 (1981).

* cited by examiner

METHOD OF FABRICATING A POLYMER MATRIX COMPOSITE ELECTROMAGNETIC SHIELDING STRUCTURE

BACKGROUND

Polymer matrix composite structures can be modified to form electromagnetic interference (EMI) shielding materials. For example, EMI shielding in the form of metal-coated fibers forming a discontinuous phase in a continuous phase matrix material is disclosed in U.S. Pat. No. 4,935,296. Radar absorbing materials are described in U.S. Pat. No. 5,661,484. Electrically conductive laminates, conductive coatings, conductive adhesives, conductive inks, conductive gaskets and conductive caulking and sealing compounds using metal coated fibers are disclosed in U.S. Pat. No. 4,983,456. Electrically conductive bulk, granular or nodular molding compounds comprising a multi-component filler system of particulate carbon black, graphite and metal particles are disclosed in U.S. Pat. No. 4,474,685.

Polymer matrix composites can be been manufactured by several techniques, such as preimpregnated fabric hand lay-up (so called prepreg) techniques and by resin transfer molding (RTM) techniques. Prepreg techniques generally include depositing resin on structural supports, such as a cloth, fabric or fiberglass, stacking the structural supports, and heating the stacked structural supports in an external heat source, such as an oven, an autoclave, or a heat lamp. Similarly, RTM techniques assemble dry structural reinforcements in a specifically designed tool, pump resin using a positive displacement pump, and apply pressure and/or temperature to form the polymer matrix composite structure.

With both prepreg and RTM methods, the resin flows during heating to penetrate throughout the structure and subsequently cures, thereby forming a unitary polymer matrix composite structure. However, the flow of the resin can also cause portions of the structure in the structural support to shift position, thereby forming defects and/or voids within the polymer matrix composite. In addition, the flow of resin can be incomplete in that resin does not penetrate into certain areas of the structural support and/or penetrates nonuniformly. Incomplete resin flow can also contribute to the formation of defects and/or voids within the polymer matrix composite.

SUMMARY

An exemplary method of manufacturing a polymer matrix composite electromagnetic shielding structure comprises pretreating a dry fiber reinforcement with a composition including a carrier and an electromagnetically active element, laying out the pretreated reinforcement to form a pre-form structure, applying a resin to the pre-form structure, and curing the resin at room temperature.

An exemplary method of manufacturing a polymer matrix composite electromagnetic shielding structure comprises pretreating a dry fiber reinforcement with a composition including a carrier and an electromagnetically active element, laying out the pretreated reinforcement to form a pre-form structure, applying a resin to the pre-form structure, the resin including at least one of a polyester-based resin, a vinyl ester-based resin, and an epoxy polyurethane-based resin, and curing the resin.

An exemplary method of manufacturing a polymer matrix composite electromagnetic shielding structure comprises laying out a plurality of dry fiber reinforcements, placing at least one ply between any two of the plurality of dry fiber reinforcements, the ply having a non-woven including an electromagnetically active element, applying a resin to the plurality of dry fiber reinforcements and the at least one ply, and curing the resin.

An exemplary method of manufacturing a polymer matrix composite electromagnetic shielding structure comprises laying out a plurality of resin impregnated reinforcements, placing at least one ply between any two of the plurality of resin impregnated reinforcements, the ply having a non-woven including an electromagnetically active element, and curing the resin impregnated reinforcement.

An exemplary polymer matrix composite electromagnetic shielding structure comprises pretreating a dry fiber reinforcement with a composition including a carrier and an electromagnetically active element, laying out the pretreated reinforcement to form a pre-form structure, applying at least one of a polyester-based resin, a vinyl ester-based resin, an epoxy polyurethane-based resin, and an epichlorohydrin resin, and curing the resin.

BRIEF DESCRIPTION OF THE DRAWING FIGURES

The following detailed description of preferred embodiments can be read in connection with the accompanying drawings in which like numerals designate like elements and in which:

FIG. 1 schematically illustrates an exemplary method of manufacturing a polymer matrix composite electromagnetic shielding structure.

Figure 2:
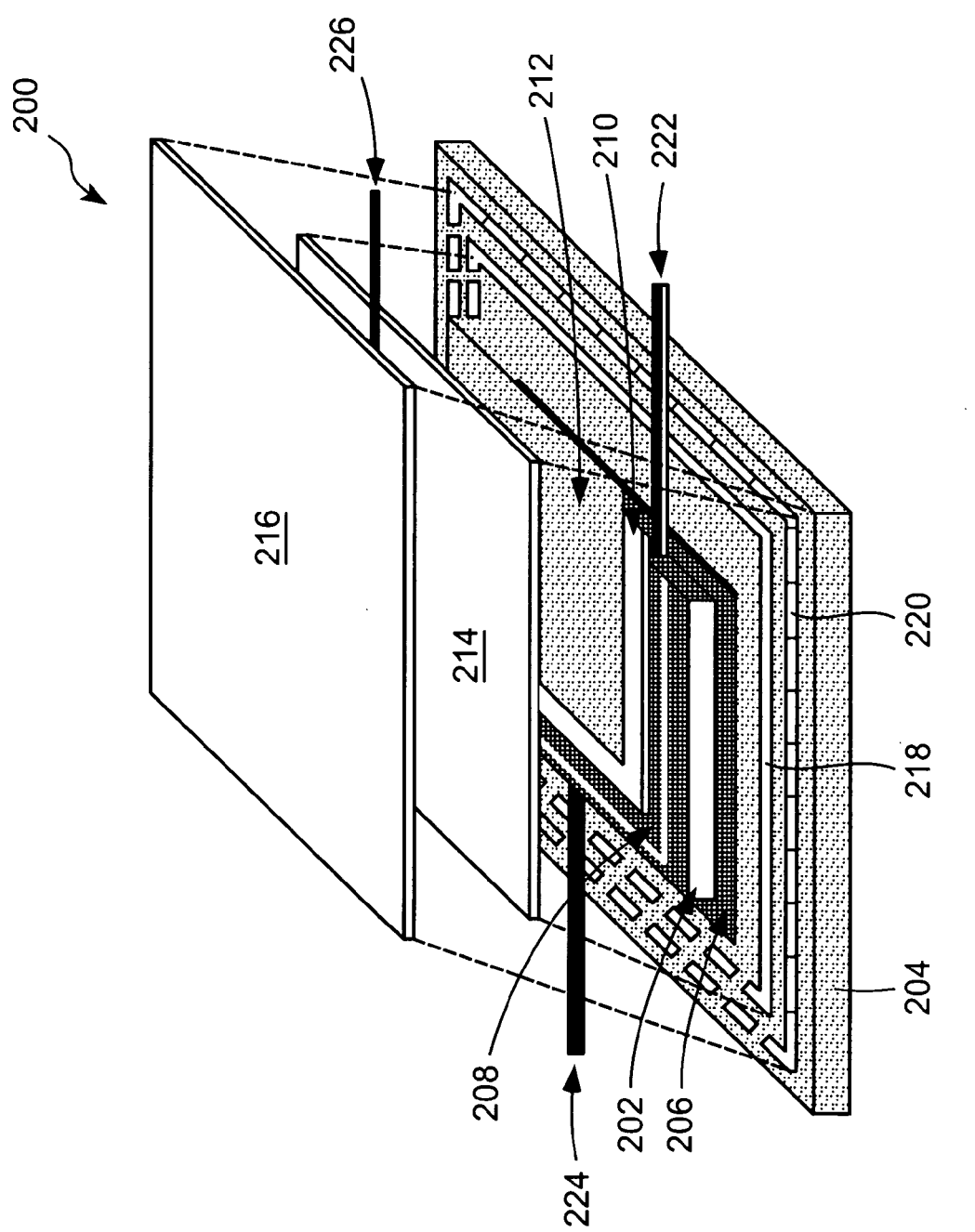

FIG. 2 shows an expanded view of an exemplary polymer matrix composite electromagnetic shielding structure in an exemplary manufacturing method.

Figure 3:
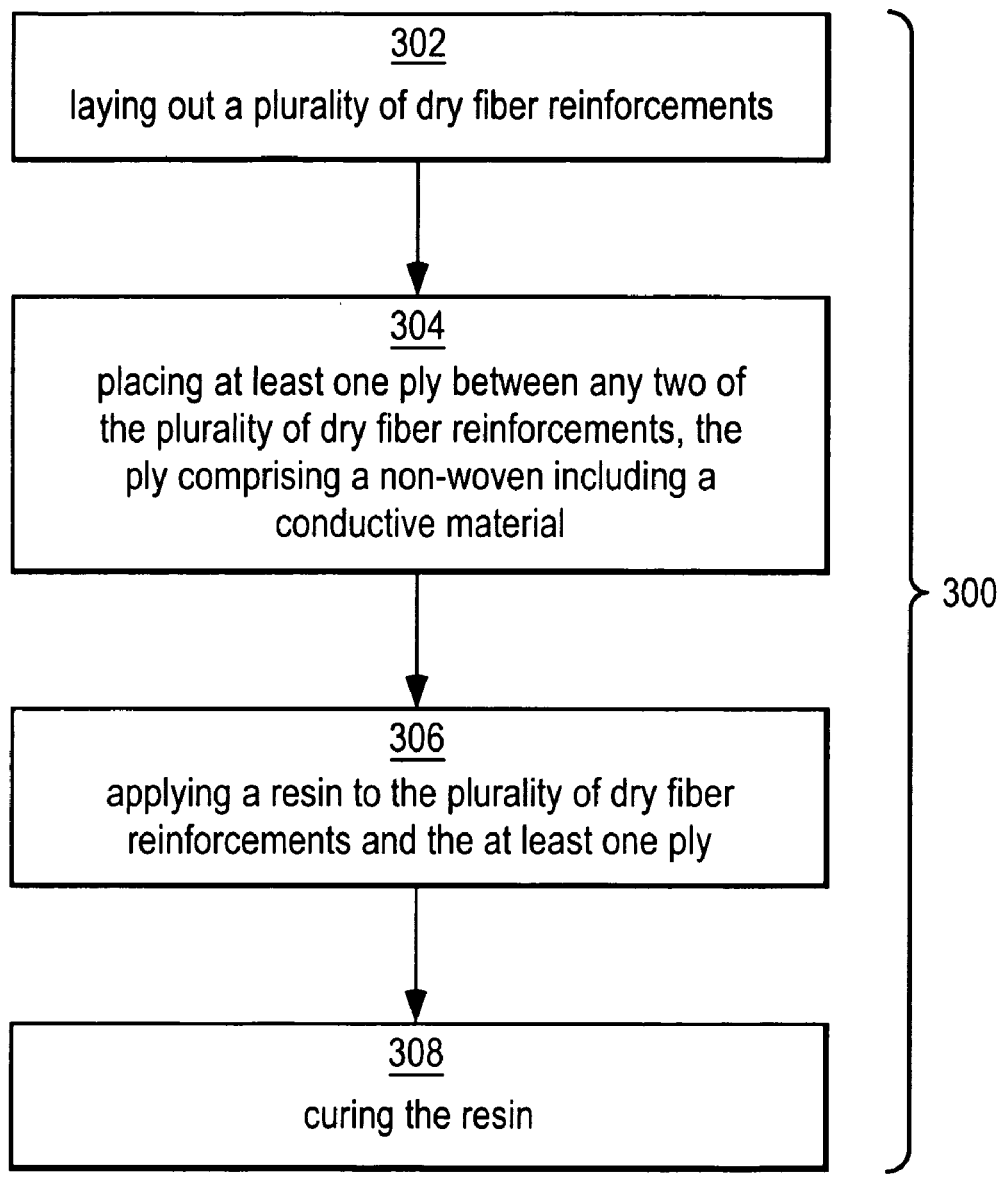

FIG. 3 schematically illustrates an exemplary method of manufacturing a polymer matrix composite electromagnetic shielding structure.

Figure 4:
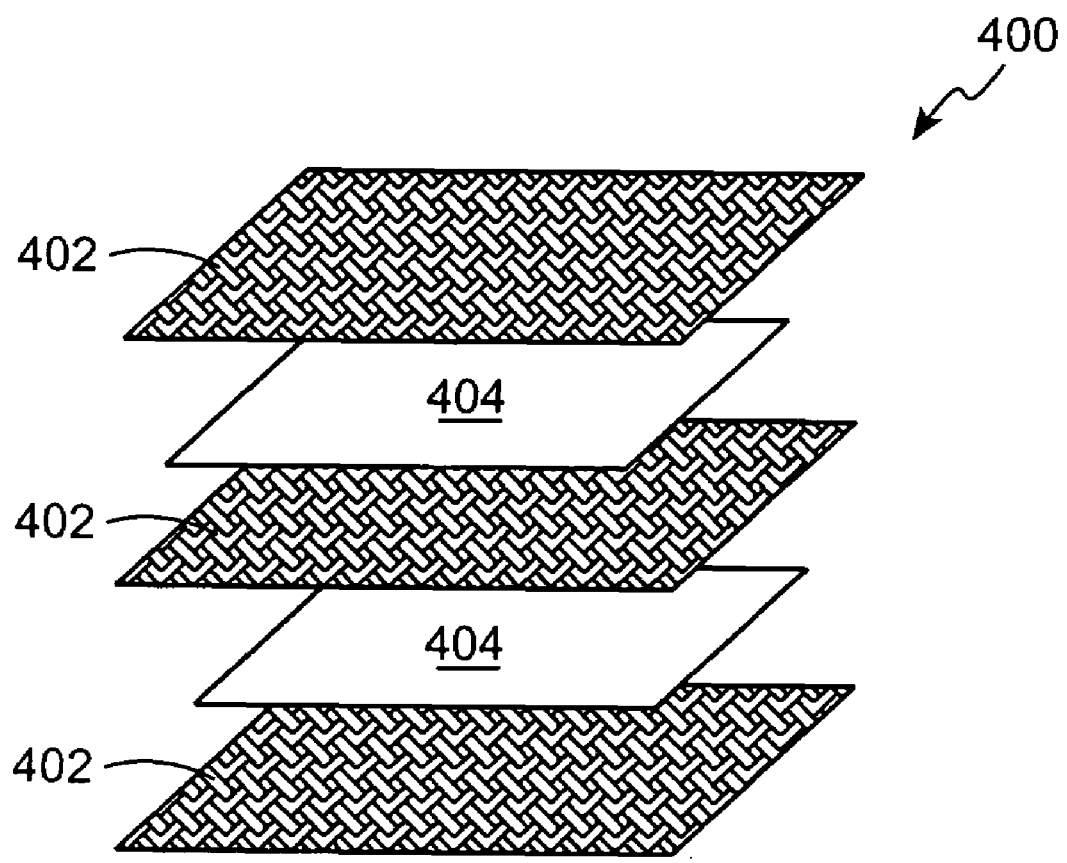

FIG. 4 shows an expanded view of an exemplary polymer matrix composite electromagnetic shielding structure.

Figure 5:
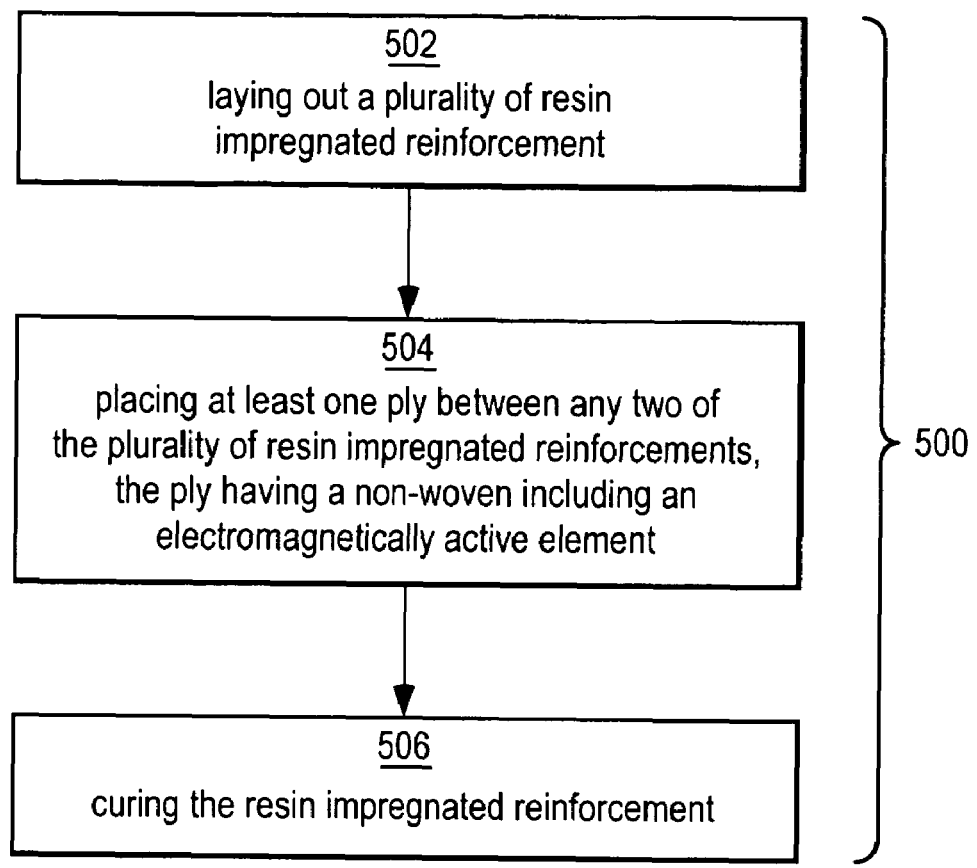

FIG. 5 schematically illustrates another exemplary method of manufacturing a polymer matrix composite electromagnetic shielding structure.

DETAILED DESCRIPTION OF PREFERRED EMBODIMENTS

FIG. 1 schematically illustrates an exemplary method of manufacturing a polymer matrix composite electromagnetic shielding structure. The exemplary method 100 comprises pretreating a dry fiber reinforcement with a composition including a carrier and an electromagnetically active element 102, laying out the pretreated reinforcement to form a preform structure 104, applying a resin to the preform structure 106, and curing the resin at room temperature 108.

The dry fiber reinforcement in exemplary embodiments is formed of a non-conductive material. For example, the dry fiber reinforcement can include a cloth, a unidirectional tape, a felt of non-conductive fibrous material, a mat of non-conductive fibrous material, or combinations thereof. Non-conductive fibrous material can include glass, quartz, polyaramids, polyolefins, and combinations thereof. In one exemplary embodiment, the dry fiber reinforcement is fiberglass.

The composition can include a carrier and an electromagnetically active element. In an exemplary embodiment, the carrier includes a solvent and a tackifier. Any suitable solvent and tackifier can be used where the solvent and tackifier are compatible and the tackifier is compatible with the resin to be used in the composite, e.g. the solvent solvates the tackifier and the tackifier is dissolved by the resin. For example, the solvent can be toluene or styrene and the tackifier can be paraffin for use with polyester or vinyl ester resins at room temperature. In an exemplary composition, the carrier is composed of one gram of paraffin for every 18.75 grams of toluene.

The behavior of the electromagnetically active elements are used to tailor the polymer matrix composite materials to produce high performance, broadband electromagnetic (EM) shielding and/or attenuating materials or structures. Several parameters can be adjusted to obtain the desired shielding effect, including length, diameter, conductivity (or electrical resistance) of the electromagnetically active element and volume percent (vol. %) of electromagnetically active element per unit volume of structure. For example, a length and an electrical resistance of the electromagnetically active element within the nonwoven ply is chosen to maximize a shielding effect at a frequency or frequencies. In addition, the type of electromagnetically active element contributes to the shielding response. For example, a Debye-type electromagnetically active element effects the complex permittivity of the shielding structure through relaxation mechanisms; a Lorentx-type electromagnetically active element effects the complex permittivity of the shielding structure through resonance mechanisms. In addition, different conductivities of electromagnetically active element have different frequency responses, with higher conductivities having a greater impact on Lorentizian parameters of complex permittivity and lower conductivities having a greater impact on Debye parameters of complex permittivity. One or both of these types of electromagnetically active elements can be utilized to obtain a desired. The choice of electromagnetically active elements is within the design choice to obtain shielding at a particular frequency of electromagnetic radiation.

In an exemplary method of selecting the type of electromagnetically active element and the characteristics of the electromagnetically active element and loading of electromagnetically active elements in a polymer matrix composite electromagnetic shielding structure, a physical model and corresponding computer software can be used to predict the electrical characteristics of the polymer matrix composite materials with electromagnetically active elements. Models for selecting the properties of the electromagnetically active element were based upon the work of H. Wade Swinford, "Electromagnetic Behavior of Radar Absorbing Chaff (RAC)", Naval Weapons Center Technical Note 354-43 (1975) and Arthur Gauss, Jr., "RACO, A New Type of Radar Absorbing Coating", Technical Report ARBRL-TR-02357 (1981). These references provide a Debye model (relaxation oscillator) for the cylindrical, electric dipoles dispersed in air (chaff).

These models can be extended by accounting for dipoles dispersed in dielectric media other than air, an improved depolarization factor for the small cylinders and for multiple dipole species in the same dielectric media or binder system. In addition, a Lorentzian model can account for the use of a damped oscillator or resonant dipole in the polymer matrix composite material. This resonant dipole model can be implemented in computer software using an equivalent circuit model similar to that described by Arthur Gauss, Jr. Using these models provides considerable flexibility to tailor attenuation levels and operational frequency bandwidths for the polymer matrix composite materials.

The electromagnetically active element of the composition can include an electromagnetically active fiber, filament, particle or a mixture thereof. For example, the electromagnetically active fiber, filament, or particle can have a composition including a carbon, a metal-plated carbon fiber, a metal or a mixture thereof. Examples of suitable carbon includes polyacrylonitrile (PAN) carbon, pitch carbon, graphite or mixtures thereof. Examples of suitable metal-coated carbon fibers include carbon fibers with chemical vapor deposition (CVD) physical vapor deposition (PVD), or electrochemically plated metals, such as nickel-coated carbon. In addition to nickel, examples of suitable metals include aluminum, copper, stainless steel, iron, titanium, alloys thereof or mixtures thereof. Suitable electromagnetically active elements are also disclosed in U.S. Pat. No. 5,400,043, the entire contents of which are incorporated herein by reference.

The electromagnetically active element contributes to the electromagnetic shielding properties of the polymer matrix composite structure. In an exemplary embodiment of a Lorentz-type absorber, the electromagnetically active element can have a length approximately equal to one-half of a wavelength of a predetermined threat frequency or frequencies, such as a radio frequency (RF) or a millimeter-wave frequency (MMW). Other electromagnetically active elements, such as Debye-type absorbers, can be used in the polymer matrix composite structure. These electromagnetically active elements include broadband absorbers, such as the broadband absorbers disclosed in U.S. Pat. No. 5,661,484, the entire contents of which are incorporated herein by reference, conductive fibers, such as the conductive fibers disclosed in U.S. Pat. No. 5,400,043, the entire contents of which are incorporated herein by reference, and/or frequency selective surfaces, such as the slot type openings disclosed in U.S. Pat. No. 5,400,403, the entire contents of which are herein incorporated by reference.

In another exemplary embodiment, electromagnetically active elements, e.g, conductive filaments or electric dipoles, are dispersed throughout the volume of a low loss dielectric binder to form a composite material whose frequency dependent, complex permittivity can be readily varied by adjusting the filament content, dimensions, and intrinsic conductivity. Small, cylindrical, electromagnetically active elements represent efficient electric dipoles at radio frequencies/millimeterwave frequencies (RF/MMW) so that a very small number of electromagnetically active elements per unit volume (<0.1%) yield a significant change in the macroscopic electrical properties of the polymer matrix composite material. Note that the magnetic properties of the electromagnetically active elements are the same as free space, e.g., no magnetic loss.

In an exemplary embodiment, the electromagnetically active element is present in an amount sufficient to achieve a desired shielding or to alter an electromagnetic impedance of the composite structure. For example, the electromagnetically active element can be present at less than 1 vol. %, but higher amounts of the electromagnetically active element can be used.

Pretreating the dry fiber reinforcement can be by any suitable method. For example, the composition including a carrier and an electromagnetically active element can be formed such that it can be applied by suitable techniques. Suitable techniques can include, for example, spraying, curtain coating, or filtering. The composition can be formed to flow sufficiently to be applied by the selected technique. For example, the composition can be formed to flow sufficiently by controlling the viscosity. In one embodiment using carbon fibers as the electromagnetically active element, a minimum viscosity is based on preventing clumping of the carbon.

In an exemplary embodiment, the dry fiber reinforcement can be pretreated during unrolling of a spool of dry fiber reinforcement. The pretreated material can be wound onto a spool for storage or used directly. A suitable method of pretreating is disclosed in U.S. Pat. No. 5,721,019, the entire contents of which are herein incorporated by reference. U.S. Pat. No. 5,721,019 discloses spray application with a smooth and unrestricted fluid transfer system. Controlled spraying resulting in uniform application of the fiber containing composition, a single pass method for spray depositing, and an air nozzle spray gun are also disclosed. Multiply pretreating operations can also be used.

In an exemplary method, laying out the pretreated reinforcements to form a pre-form structure can be by any suitable method. For example, the pretreated dry fiber reinforcement can be cut or otherwise fashioned into the appropriate preform structure by automated techniques. Alternatively, the pretreated reinforcement can be hand assembled to form the pre-form structure. Laying out can include, lay-up operations, layering, or other suitable shaping operations.

In an exemplary method of manufacture, applying a resin to the pre-form structure can be by any suitable method. For example, applying the resin can include a vacuum resin infusion process. The vacuum resin infusion process can comprise placing the pre-form structure in a vacuum bag, evacuating the bag, and introducing the resin by vacuum drawing the resin into the vacuum bag so as to infuse the resin throughout the pre-form structure. The infused resin can solvate a tackifier securing the conductive element in the pre-form structure, e.g., the infused resin can include a solvent compatible with the tackifier, such as toluene or styrene with paraffin, to dissolve the tackifier. The solvated tackifier is then dispersed within the infused resin or can be flushed from the vacuum bag.

Curing the resin can occur at a room temperature. As used herein, room temperature is from 40° F. to 100° F., preferably from 60° F. to 80° F., of both the structure being manufactured and the environmental conditions in which the structure is being manufactured. In an exemplary method, curing the resin at room temperature occurs without the application of an external source of heat. For example, ovens, autoclaves, heat lamps, and/or other heat sources can be eliminated from at least the curing process, preferably from the entire manufacturing process. The elimination of ovens, autoclaves, heat lamps, and/or other heat sources can significantly reduce the costs involved in the fabrication of composite parts. Generally, in resin curing systems cured at elevated temperatures, e.g., temperatures greater than 100° F., the shape and size of parts are limited by the shape and size of any external source of heat.

Examples of room temperature curing resin systems include at least one of a polyester-based resin, a vinyl ester-based resin, and an epoxy polyurethane-based resin. For example, a suitable polyester-based resin includes Polylite® 33234-18, available from Reichhold, Inc. of Durham N.C.; a suitable vinyl ester-based resin includes CORVE 8440, available from Interplastic Corp. of St. Paul, Minn.; and a suitable epoxy polyurethane-based resin includes, as an epoxy, Resinfusion 8605 available from Vantico of East Lansing, Mich. and, as a polyurethane, Smooth Cast 326, available from Smooth-On, Inc. of Easton, Pa.

FIG. 2 shows an expanded view of an exemplary polymer matrix composite electromagnetic shielding structure in an exemplary manufacturing method. In the exemplary manufacturing method 200, a preform structure 202 is positioned for infusion of resin on a support, such as a tool plate 204. The pre-form structure 202 is placed on a release film 206, which allows for subsequent removal of the impregnated pre-form structure 202 from the system, e.g., to facilitate the release of the pre-form structure 202 such that it does not adhere to the tool plate 204. A porous release film 208 is positioned over the pre-form structure 202 and serves a similar function with respect to the elements placed on that side of the pre-form structure 202, except that the porous release film allows resin to flow through the film. A distribution media 210 and a release film 212 are also suitably arranged about the preform structure 202. The distribution media 210 and the release film 212 are any suitable materials conventionally used for such purposes. The arrangement of porous and non-porous release films can be made to accommodate the infusion of resin through the porous release structure where desired.

An inner vacuum bag 214 and an outer vacuum bag 216 form, with the tool plate 204, an inner volume occupied by at least the preform structure 202. The inner vacuum bag 214 is secured over the pre-form structure 202 (and any attendant items, such as release films and distribution media) and attached to the tool plate 204 with an inner bag sealant tape 218. The outer vacuum bag 216 is positioned over the inner vacuum bag 214 and attached to the tool plate 204 by an outer bag sealant tape 220. The release film 212 assists in preventing the inner vacuum bag 214 from adhering to other structures due to the resin.

Connections to supply resin, vacuum, pressure or other media are used during the exemplary manufacturing method 200. For example, a resin inlet 222 and resin outlet 224 are positioned with an opening within the volume space occupied by the pre-form structure 202. Thus, the resin inlet 222 can port resin into the volume area including the pre-form structure 202 and the resin outlet 224 can port resin out of that same volume area. For example, the resin can be forced under pressure through the resin inlet 222, can be drawn through the resin inlet 222 by a vacuum applied to the resin outlet 224, or combinations of these methods. A pressure vacuum outlet 226 has an opening located between the inner vacuum bag 214 and the outer vacuum bag 216. The pressure vacuum outlet 226 can port a fluid medium, such as air or a liquid, to apply pressure and/or a vacuum to the space between the inner vacuum bag 214 and the outer vacuum bag 216.

FIG. 3 schematically illustrates an exemplary method of manufacturing a polymer matrix composite electromagnetic shielding structure. The exemplary method 300 comprises laying out a plurality of dry fiber reinforcements 302, placing at least one ply between any two of the plurality of dry fiber reinforcements, the ply comprising a non-woven including a conductive material 304, applying a resin to a plurality of dry fiber reinforcements and the at least one ply 306, and curing the resin 308.

Laying out a plurality of dry fiber reinforcements can be by any suitable method. For example, the dry fiber reinforcements can be layered, multilayered, stacked, placed in a shell mold, and so forth to provide the desired shape for the polymer matrix composite electromagnetic shielding structure.

In an exemplary embodiment, the dry fiber reinforcement is formed of a non-conductive material. The dry fiber reinforcement can include a cloth, a unidirectional tape, a felt of non-conductive fibrous material, a mat of non-conductive fibrous material, or combinations thereof. Further, the non-conductive fibrous material can include glass, quartz, polyaramids, polyolefins, and combinations thereof. In an exemplary embodiment, the dry fiber reinforcement is fiberglass.

The at least one ply placed between any two of the plurality of dry fiber reinforcements can be of any suitable form. In an exemplary embodiment, the ply comprises a non-woven including a conductive material. For example, the non-woven can be a prefabricated fibrous veil. Suitable prefabricated fibrous veils are available from Hollingsworth and Vose, located in East Walpole, Mass., and are commercially available as advanced fiber non-wovens.

In an exemplary embodiment, the non-woven has a desired electromagnetic energy absorption property. For example, the non-woven can have an isotropic electromagnetic energy absorption property. The electromagnetic energy can be, for example, a desired threat frequency or frequencies, such as a radio frequency (RF) and/or a specific RF energy and/or a millimeterwave frequency (MMW)and/or a specific MMW energy. Multiple non-wovens each having a desired electromagnetic energy absorption property and collectively having a plurality of desired electromagnetic energy absorption properties can also be used to provide absorption of a broadband energy, such as a range of RF energy, MMW energy, and so forth.

In an exemplary embodiment, the non-woven can also include an electromagnetically active fiber, filament, particle, or combinations thereof to form a loaded non-woven. The electromagnetically active fiber, filament, or particle can have, for example, a composition including a carbon, a metal-plated carbon fiber, a metal, or a mixture thereof. Examples of suitable electromagnetically active fibers, filaments, or particles include PAN carbon, pitch carbon, nickel-coated carbon, or mixtures thereof. Examples of suitable fibers, filaments, particles, or combinations thereof, are disclosed in U.S. Pat. No. 5,400,043, the entire contents of which are herein incorporated by reference.

The electromagnetically active fiber, filament, or particle in exemplary embodiments can be present in an amount effective to altar an electromagnetic impedance of the polymer matrix composite structure to a desired frequency or frequencies, such as a radio frequency and/or a millimeterwave frequency. In exemplary embodiments, the electromagnetically active fiber, filament, or particle is arranged randomly and distributed homogeneously, e.g., without any polarization dependence, within the polymer matrix composite structure to alter the electromagnetic impedance of the polymer matrix composite structure to a desired frequency or frequencies.

In an exemplary method, the plurality of dry fiber reinforcements and the at least one ply form a pre-form structure. In the exemplary method, placing at least one ply includes interleaving a plurality of plies throughout a thickness of the pre-form structure, e.g., the ply can be placed alternately with one or more dry fiber reinforcements in a stacked arrangement, portions of the pre-form structure can have increased or decreased numbers of plies between dry fiber reinforcements, or any other suitable arrangement of plies within the dry fiber reinforcement. The number and interleaved position of the ply within the polymer matrix composite structure alters an electromagnetic impedance of the polymer matrix composite structure to a desired frequency or frequencies, such as a radio frequency and/or a millimeterwave frequency. The number and position of the ply, e.g., orientation and interleaved position, can be selected based on the physical model and corresponding computer software described herein in connection with predicting the electrical characteristics of the polymer matrix composite materials with electromagnetically active elements. In an exemplary embodiment, the at least one ply is in the interior of the pre-form structure.

In the exemplary method, applying a resin to the plurality of dry fiber reinforcements and the at least one ply can be by any suitable method. For example, applying the resin can include hand lay-up fabrication, vacuum bagging, resin transfer molding, vacuum assisted resin transfer molding, resin infusion processing, vacuum assisted resin infusion processing, vacuum injection packaging, Seeman Composites Resin Infusion Molding Process (SCRIMP), or combinations thereof.

In the exemplary manufacturing method, curing the resin can occur by any suitable method. For example, curing the resin can occur without heat, e.g., without ovens, autoclaves, heat lamps, and/or other heat sources. A non-heat induced resin curing system can include a room temperature curing resin system at room temperature, such as the room temperature curing resin system disclosed and described herein in connection with FIGS. 1 and 2. Alternately, curing the resin can occur at elevated temperatures in an oven, in an autoclave, with a heat lamp, and/or other heat sources in which an external heat source is used to cure the resin. Resin systems suitable for use as a resin that cures at elevated temperatures can be selected based on the structural requirements of the application, such as high temperature or low temperature working environment, aerospace applications and so forth. An example of a suitable elevated temperature curing resin system includes epichlorohydrin (Sara III) available from Shell Oil Company as EPON® Resin 828, although any suitable resin can be used, such as aerospace or marine resins.

FIG. 4 shows an expanded view of an exemplary polymer matrix composite electromagnetic shielding structure. In the exemplary structure 400, dry fiber reinforcement 402 is shown in a stacked arrangement. The at least one ply, here shown as ply 404, is interleaved between single dry fiber reinforcements on the interior of the structure. Upon completion of the manufacturing method, the exemplary embodiment of the polymer matrix composite electromagnetic shielding structure shown in FIG. 4 has a multi-layer cross-section of alternating dry fiber reinforcement and ply, e.g., the nonwoven including a conductive material.

FIG. 5 schematically illustrates another exemplary method of manufacturing a polymer matrix composite electromagnetic shielding structure. The exemplary method 500 comprises laying out a plurality of resin impregnated reinforcement 502, placing at least one ply between any two of the plurality of resin impregnated reinforcements, the ply having a non-woven including an electromagnetically active element 504, and curing the resin impregnated reinforcement 506.

Laying out a plurality of resin impregnated reinforcement can be by any suitable method. For example, the resin impregnated reinforcement can be layered, multilayered, stacked, placed in a shell mold, and so forth to provide the desired shape for the polymer matrix composite electromagnetic shielding structure.

In an exemplary embodiment, the resin impregnated reinforcement is formed of a non-conductive material having a resin incorporated therein. The resin impregnated reinforcement can include a cloth, a unidirectional tape, a felt of non-conductive fibrous material, a mat of non-conductive fibrous material, or combinations thereof having a resin incorporated by entanglement, adhesion, or other suitable method. Further, the non-conductive fibrous material can include glass, quartz, polyaramids, polyolefins, and combinations thereof. In an exemplary embodiment, the resin impregnated reinforcement is fiberglass.

The at least one ply placed between any two of the plurality of resin impregnated reinforcement can be of any suitable form. In an exemplary embodiment, the ply comprises a non-woven including a conductive material. For example, the non-woven can be a prefabricated fibrous veil. Suitable prefabricated fibrous veils are available from Hollingsworth and Vose, located in East Walpole, Mass., and are commercially available as advanced fiber non-wovens.

In an exemplary embodiment, the non-woven has a desired electromagnetic energy absorption property. For example, the non-woven can have an isotropic electromagnetic energy absorption property. The electromagnetic energy can be, for example, a desired threat frequency or frequencies, such as a radio frequency (RF) and/or a specific RF energy and/or a millimeterwave frequency (MMW)and/or a specific MMW energy. Multiple non-wovens each having a desired electromagnetic energy absorption property and collectively having a plurality of desired electromagnetic energy absorption properties can also be used to provide absorption of a broadband energy, such as a range of RF energy, MMW energy, and so forth.

In an exemplary embodiment, the non-woven can also include an electromagnetically active fiber, filament, particle, or combinations thereof to form a loaded non-woven. The electromagnetically active fiber, filament, or particle can have, for example, a composition including a carbon, a metal-plated carbon fiber, a metal, or a mixture thereof. Examples of suitable electromagnetically active fibers, filaments, or particles include PAN carbon, pitch carbon, nickel-coated carbon, or mixtures thereof. Examples of suitable fibers, filaments, particles, or combinations thereof, are disclosed in U.S. Pat. No. 5,400,043, the entire contents of which are herein incorporated by reference.

The electromagnetically active fiber, filament, or particle in exemplary embodiments can be present in an amount effective to altar an electromagnetic impedance of the polymer matrix composite structure to a desired frequency or frequencies, such as a radio frequency and/or a millimeterwave frequency. In exemplary embodiments, the electromagnetically active fiber, filament, or particle is arranged randomly and distributed homogeneously, e.g., without any polarization dependence, within the polymer matrix composite structure to alter the electromagnetic impedance of the polymer matrix composite structure to a desired frequency or frequencies.

In an exemplary method, the plurality of resin impregnated reinforcement and the at least one ply form a pre-form structure. In the exemplary method, placing at least one ply includes interleaving a plurality of plies throughout a thickness of the pre-form structure, e.g., the ply can be placed alternately with one or more resin impregnated reinforcement in a stacked arrangement, portions of the pre-form structure can have increased or decreased numbers of plies between resin impregnated reinforcement, or any other suitable arrangement of plies within the dry fiber reinforcement. The number and interleaved position of the ply within the polymer matrix composite structure alters an electromagnetic impedance of the polymer matrix composite structure to a desired frequency or frequencies, such as a radio frequency and/or a millimeterwave frequency. The number and position of the ply, e.g., orientation and interleaved position, can be selected based on the physical model and corresponding computer software described herein in connection with predicting the electrical characteristics of the polymer matrix composite materials with electromagnetically active elements. In an exemplary embodiment, the at least one ply is in the interior of the pre-form structure.

In the exemplary method, applying a resin to the plurality of resin impregnated reinforcement and the at least one ply can be by any suitable method. For example, applying the resin can include hand lay-up fabrication, vacuum bagging, resin transfer molding, vacuum assisted resin transfer molding, resin infusion processing, vacuum assisted resin infusion processing, vacuum injection packaging, Seeman Composites Resin Infusion Molding Process (SCRIMP), or combinations thereof.

In the exemplary manufacturing method, curing the resin can occur by any suitable method. For example, curing the resin can occur without heat, e.g., without ovens, autoclaves, heat lamps, and/or other heat sources. A non-heat induced resin curing system can include a room temperature curing resin system at room temperature, such as the room temperature curing resin system disclosed and described herein in connection with FIGS. 1 and 2. An example of a suitable resin system includes a polyester or a vinyl ester resin system. Alternatively, curing the resin can occur at elevated temperatures in an oven, in an autoclave, with a heat lamp, and/or other heat sources in which an external heat source is used to cure the resin. Resin systems suitable for use as a resin that cures at elevated temperatures can be selected based on the structural requirements of the application, such as high temperature or low temperature working environment, aerospace applications and so forth. An example of a suitable resin system includes epichlorohydrin (Sara III) available from Shell Oil Company as EPON® Resin 828, although any suitable resin can be used, such as aerospace or marine resins.

While the present invention has been described by reference to the above-mentioned embodiments, certain modifications and variations will be evident to those of ordinary skill in the art. Therefore, the present invention is to be limited only by the scope and spirit of the appended claims.

What is claimed is:

1. A method of manufacturing a polymer matrix composite electromagnetic shielding structure, the method comprising:
    laying out a plurality of dry fiber reinforcements free of resin;
    placing at least one ply between any two of the plurality of dry fiber reinforcements, the ply being a non-woven including an electromagnetically active element in an amount of less than 0.1 vol.% per unit volume of polymer matrix composite;
    applying a resin to the plurality of dry fiber reinforcements and the at least one ply; and
    curing the resin.

2. The method of claim 1, wherein the dry fiber reinforcement is formed of a non-conductive material.

3. The method of claim 1, wherein the non-woven is a prefabricated fibrous veil.

4. The method of claim 1, wherein applying a resin includes at least one of hand lay-up fabrication, vacuum bagging, resin transfer molding, vacuum assisted resin transfer molding, resin infusion processing, vacuum assisted resin infusion processing, vacuum injection packaging, and SCRIMP.

5. The method of claim 1, wherein the plurality of dry fiber reinforcements and the at least one ply form a pre-form structure, and wherein the at least one ply is in an interior of the pre-form structure.

6. The method of claim 1, wherein the resin is at least one of a polyester-based resin, a vinyl ester-based resin, an epoxy polyurethane-based resin and an epichlorohydrin resin.

7. The method of claim 1, wherein the dry fiber reinforcement includes at least one of a cloth, a unidirectional tape, a felt of nonconductive fibrous material, and a mat of nonconductive fibrous material.

8. The method of claim 7, wherein the nonconductive fibrous material includes at least one of glass, quartz, polyaramids, and polyolefins.

9. The method of claim 1, wherein the non-woven has an isotropic electromagnetic energy absorption property.

10. The method of claim 9, where the electromagnetic energy is at least one of a radio frequency energy and a millimeterwave energy.

11. The method of claim 1, wherein curing the resin occurs at room temperature.

12. The method of claim 11, wherein room temperature is from 40° F. to 100° F.

13. The method of claim 12, wherein the resin is at least one of a polyester-based resin, a vinyl ester-based resin, and an epoxy polyurethane-based resin.

14. The method of claim 1, wherein the plurality of dry fiber reinforcements and the at least one ply form a pre-form structure, and wherein placing at least one ply includes interleaving a plurality of plies throughout a thickness of the pre-form structure.

15. The method of claim 14, wherein a number and an interleaved position of the ply within the polymer matrix composite structure alters an electromagnetic impedance of the polymer matrix composite structure to a desired frequency or frequencies.

16. The method of claim 15, wherein the desired frequency is at least one of a radio frequency and a millimeterwave frequency.

17. The method of claim 1, wherein the non-woven includes at least one of an electromagnetically active fiber, filament, and particle.

18. The method of claim 17, wherein at least one of the electromagnetically active fiber, filament, and particle is present in an amount effective to alter an electromagnetic impedance of the polymer matrix composite structure to a desired frequency or frequencies.

19. The method of claim 18, wherein the desired frequency is at least one of a radio frequency and a millimeterwave frequency.

20. The method of claim 17, wherein at least one of the electromagnetically active fiber, filament, and particle is arranged within the polymer matrix composite structure to alter an electromagnetic impedance of the polymer matrix composite structure at a desired frequency or frequencies.

21. The method of claim 20, wherein the desired frequency is at least one of a radio frequency and a millimeterwave frequency.

22. The method of claim 17, wherein at least one of the electromagnetically active fiber, filament, and particle has a composition including at least one of PAN carbon, pitch carbon, metal-coated carbon, and a metal.

23. The method of claim 22, wherein a metal in the metal-coated carbon includes at least one of aluminum, copper, stainless steel, iron, titanium, nickel, and alloys or mixtures thereof.

24. The method of claim 22, wherein a metal includes at least one of aluminum, copper, stainless steel, iron, titanium, nickel, and alloys or mixtures thereof.

* * * * *